United States Patent [19]
Abe et al.

[11] Patent Number: 5,005,129
[45] Date of Patent: Apr. 2, 1991

[54] DIAGNOSIS SYSTEM FOR A MOTOR VEHICLE

[75] Inventors: Kunihiro Abe, Higashi-Murayama; Masanori Sakamoto, Nishitama; Tomoya Kobayashi, Fuchi, all of Japan

[73] Assignee: Fuji Jukogyo Kabushiki Kaisha, Tokyo, Japan

[21] Appl. No.: 314,647

[22] Filed: Feb. 21, 1989

[30] Foreign Application Priority Data

Feb. 29, 1988 [JP] Japan ............................... 63-046331

[51] Int. Cl.$^5$ .................... G01M 15/00; F02D 41/26; F02P 17/00
[52] U.S. Cl. ............................. 364/424.03; 73/117.2; 364/431.01; 364/551.01
[58] Field of Search ...................... 364/431.01, 424.03, 364/551.01; 73/116, 117.2, 117.3, 119 R, 119 A

[56] References Cited

U.S. PATENT DOCUMENTS

| | | | |
|---|---|---|---|
| 4,527,424 | 7/1985 | Takahashi | 73/119 A |
| 4,694,408 | 9/1987 | Zaleski | 364/551.01 |
| 4,748,843 | 6/1988 | Schäfer et al. | 73/117.3 |
| 4,757,463 | 7/1988 | Ballou et al. | 364/551.01 |
| 4,926,330 | 5/1990 | Abe et al. | 364/424.03 |

FOREIGN PATENT DOCUMENTS 59-61740  4/1984  Japan ............................... 364/424.03

*Primary Examiner*—Felix D. Gruber
*Attorney, Agent, or Firm*—Martin A. Farber

[57] ABSTRACT

A system for diagnosing a motor vehicle has a diagnosis device including a computer having a central processing unit and a ROM. The ROM stores a plurality of programs for diagnosing an electronic control system for controlling an engine. The electronic control system has a self-diagnosis function and a nonvolatile memory for storing trouble data as a result of the self-dignosis. A communication system is provided in the diagnosis device for supplying a trouble check signal to the electronic control system. In response to the trouble check signal, the electronic control system derives the trouble data from the nonvolatile memory and sends the trouble data to the diagnosis device.

3 Claims, 11 Drawing Sheets

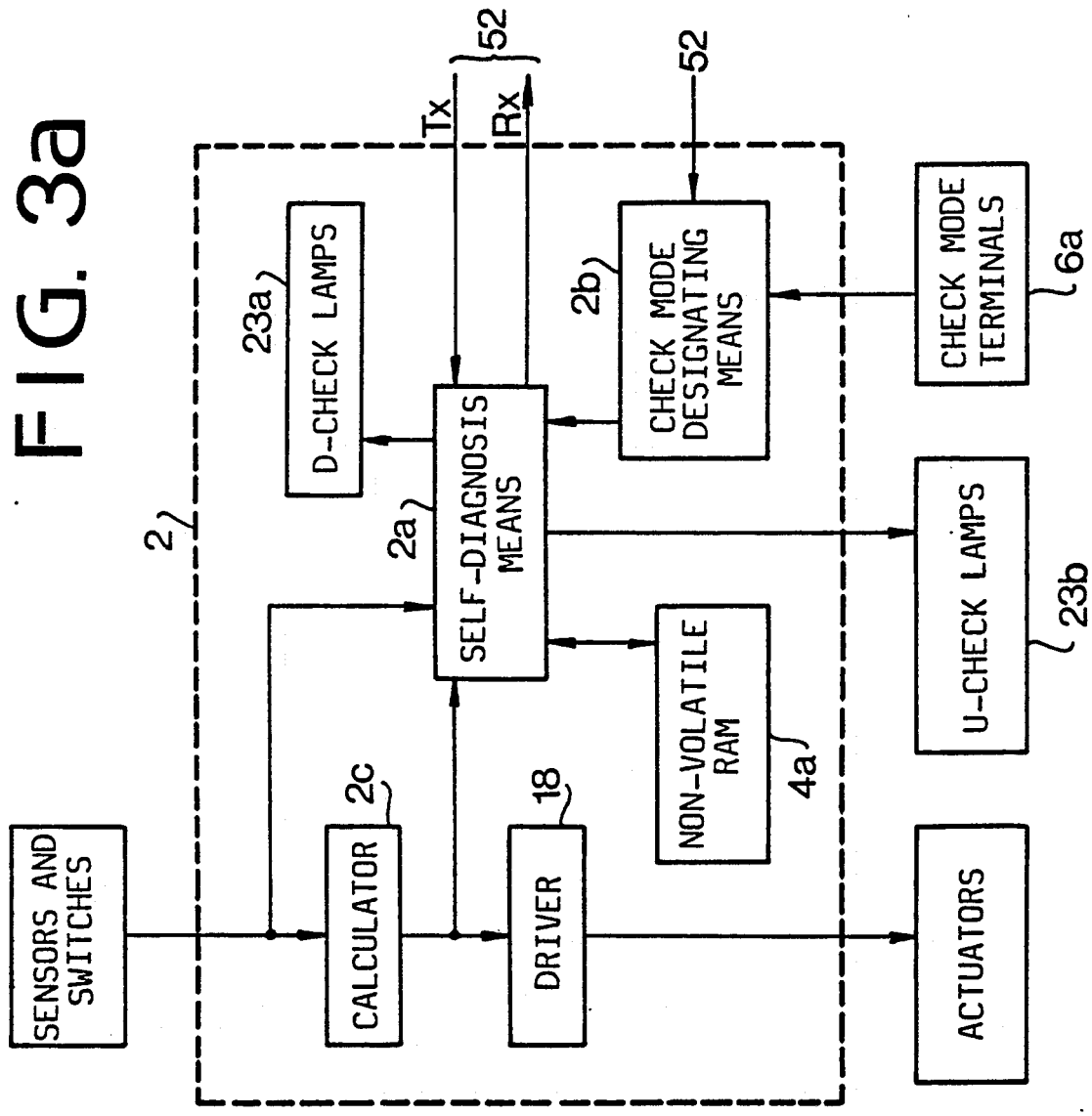

DIAGNOSIS SYSTEM FOR A MOTOR VEHICLE

BACKGROUND OF THE INVENTION

The present invention relates to a diagnosis system for a motor vehicle.

Recently, motor vehicles have been equipped with an electronic control system for controlling various components of an engine, such as fuel injectors, thereby improving driveability, exhaust gas emission, fuel consumption, and engine power. The electronic control system controls the components based on information represented by output signals from various sensors for detecting engine operating conditions. Accordingly, if malfunctions of components and sensors occur, the engine does not properly operate.

However, because of the complexity of the electronic control system, it is difficult to immediately find out the trouble. Accordingly, a trouble diagnosis device for easily checking the electronic control system should be provided as equipment in an auto shop.

Japanese Patent Application Laid Open 59-61740 discloses as electronic control system provided with a self-diagnosis system where signaling lamps provided on the vehicle are lit or flashed when abnormalities occur in the sensors and actuators such as injectors. Data about the trouble are written in a nonvolatile random-access memory (RAM) at a predetermined address, which is provided in the electronic control system.

In the above-described self-diagnosis system, troubles are checked in two trouble check modes, one of which is a D-check (dealer check) mode and the other is a U-check (user check) mode. The U-check mode is usually set so that if abnormalities occur while driving under various driving conditions, U-check lamps provided on a dashboard of the vehicle are lit or flashed, thereby warning a driver of the trouble. Trouble data on the abnormalities including those which are not likely to recur are written in the nonvolatile memory. The driver, noting the trouble, takes the vehicle to an auto shop where a diagnostician switches the trouble check mode to the D-check mode. The self-diagnosis is operated under a predetermined engine operating condition and abnormalities are indicated by D-check lamps provided in the electronic control system. Thus, a precise self-diagnosis is performed.

The trouble check modes are changed from the U-check mode to D-check mode and vice versa by operating trouble check terminals connected to the electronic control system. However, the electronic control system and the terminals are disposed inside the dashboard of the vehicle so as not to obstruct the driving. In order to change the mode, the dashboard therefore must be detached. Furthermore the terminals are manipulated in a small space, which is a troublesome operation.

SUMMARY OF THE INVENTION

The object of the present invention is to provide a self-diagnosis system where trouble check modes can be easily changed with a simple operation.

According to the present invention, there is provided a system for diagnosing an electronic control system for controlling an engine mounted on a vehicle, comprising the electronic control system having self-diagnosis means, a nonvolatile memory for storing trouble data as a result of self-diagnosis through the self-diagnosis means, a diagnosis device including a computer having a control unit and a memory, the memory having a plurality of programs for diagnosing the electronic system, connecting means connecting the diagnosis device to the electronic control system, and input means for inputting a trouble check mode to the memory.

A communication system is provided in the diagnosis device responsive to the input trouble check mode for supplying a trouble check signal to the electronic control system, and a trouble check mode designating means is provided in the electronic control system and responsive to the trouble check signal for deriving the trouble data from the nonvolatile memory and for providing the trouble data to the diagnosis device.

The other objects and features of this invention will become understood from the following description with reference to the accompanying drawings.

BRIEF DESCRIPTION OF DRAWINGS

FIGS. 3a and 3b show a block diagram showing a main part of the system;

DETAILED DESCRIPTION OF THE PREFERRED EMBODIMENTS

Figure 1A:
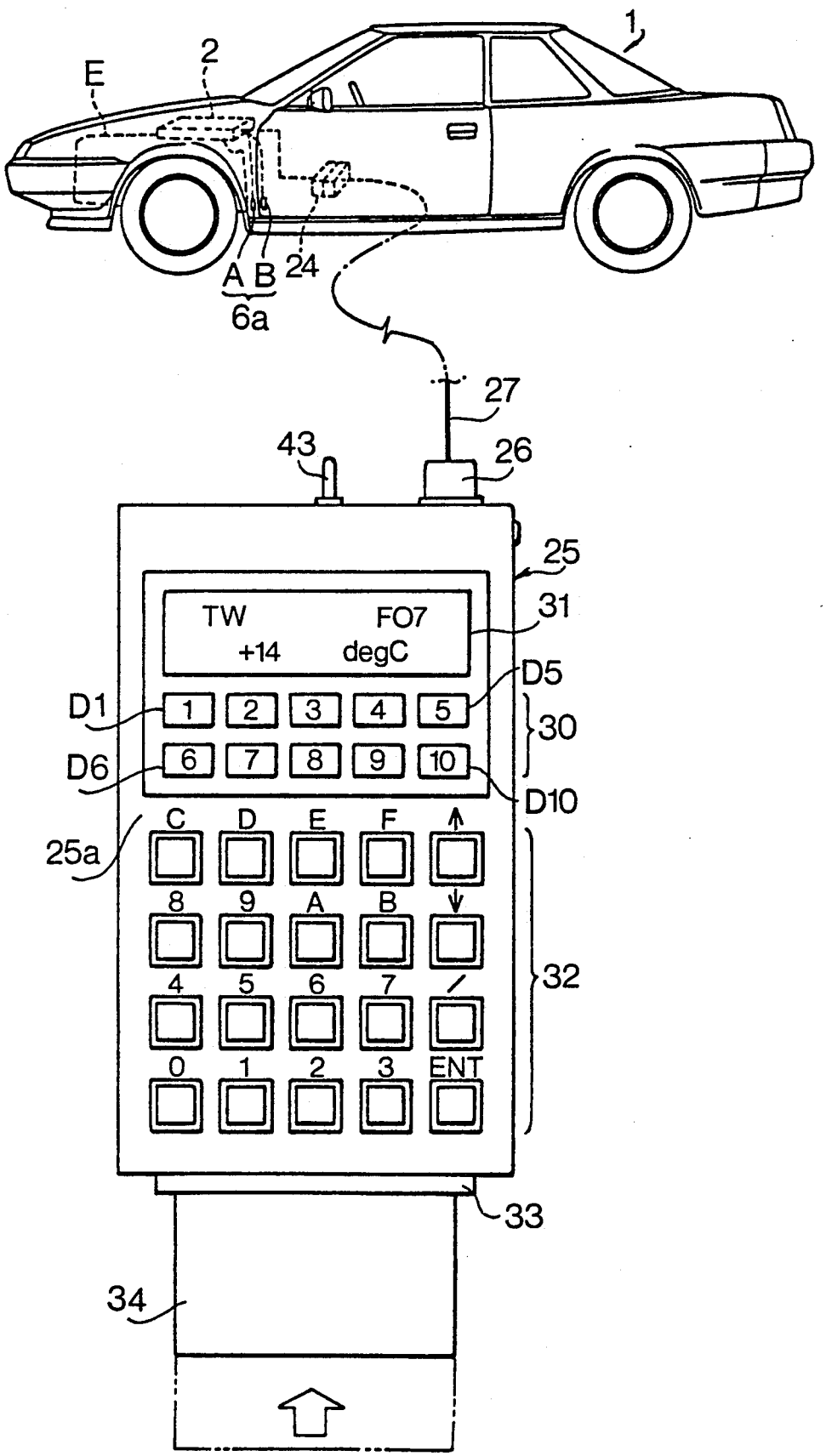
FIG. 1a is a schematic illustration of a diagnosis system according to the present invention.
Figure 1B:
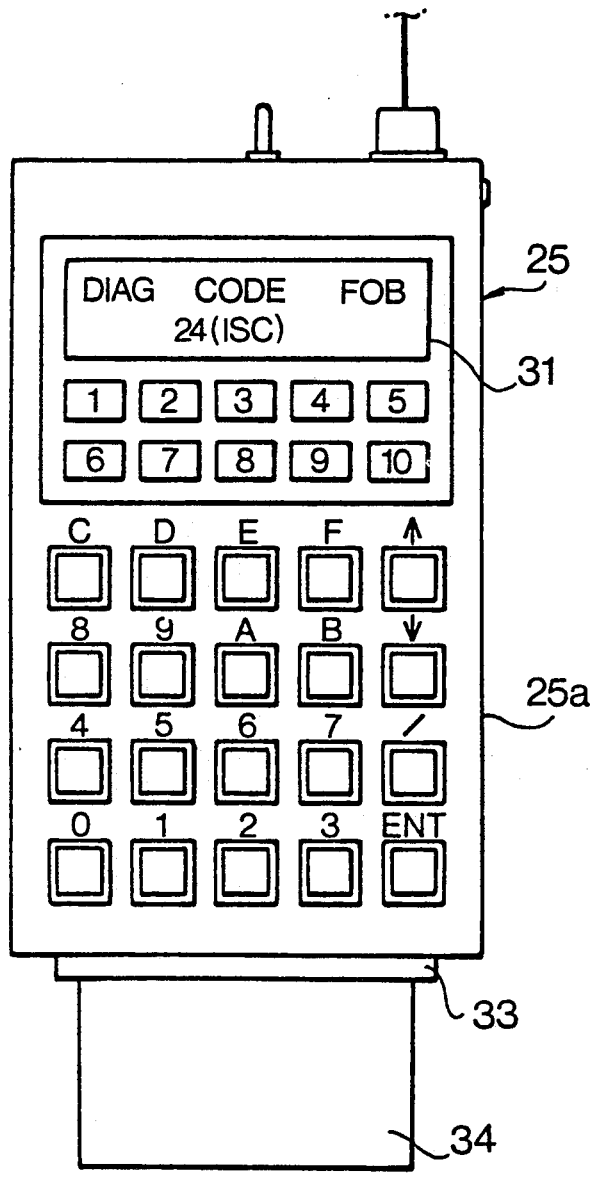
FIG. 1b shows a diagnosis device in a trouble check mode.

Referring to FIG. 1a and 1b an automobile 1 is equipped with an electronic control system 2 for controlling various components of an engine E. The electronic control system 2 is connected to an external connector 24. A portable diagnosis device 25 comprising a microcomputer is housed in a case 25a and has a connector 26, to which the connector 24 of the system 2 is connected through an adapter harness 27.

The diagnosis device 25 has a power switch 43, a liquid crystal display 31, an indicator section 30 consisting of a plurality of LED indicators, and a keyboard 32. A connector 33 is provided for connecting a detachable memory cartridge 34.

Figure 2A:
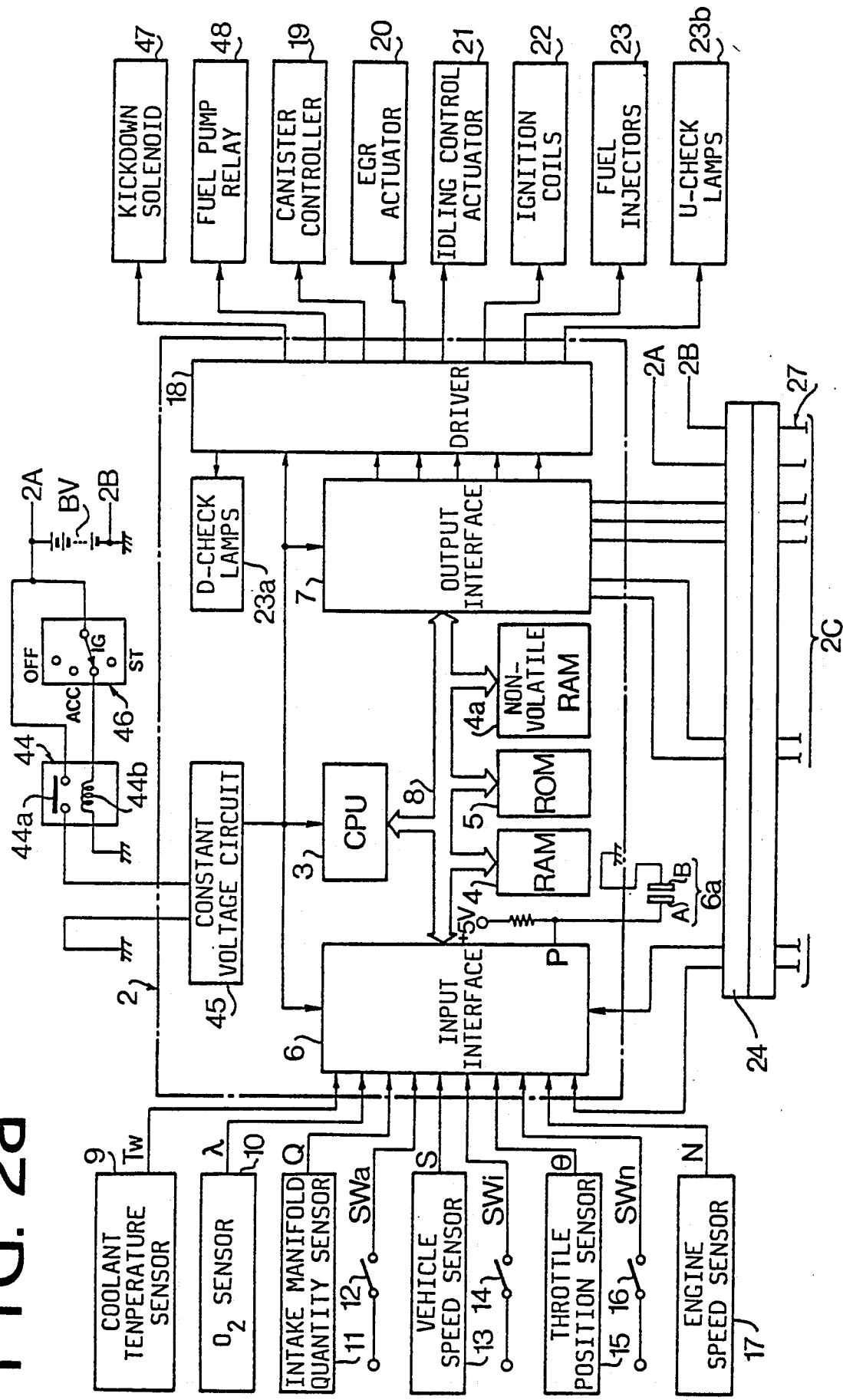
FIGS. 2a and 2b show a block diagram of the system.
Figure 2B:
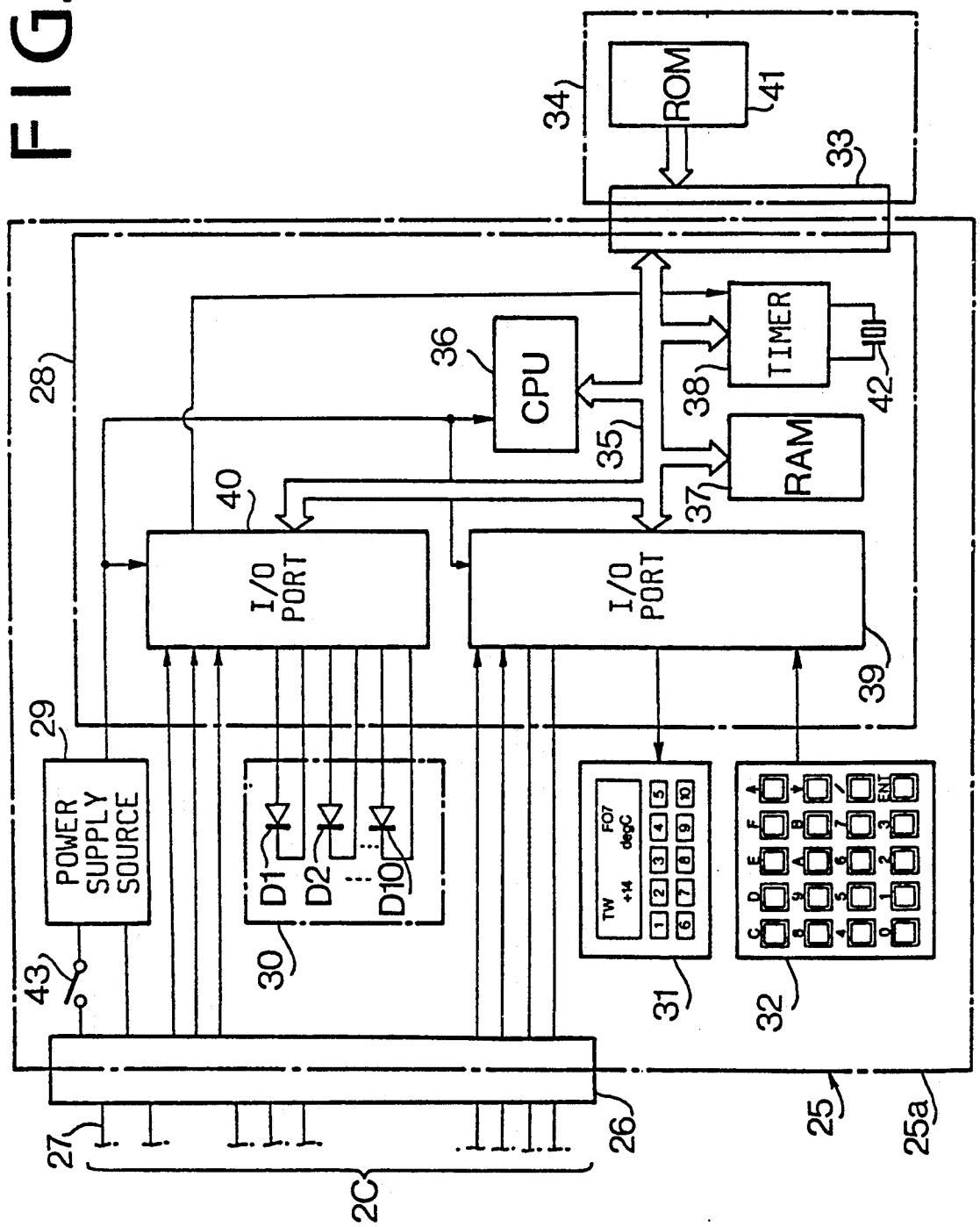

Referring to FIGS. 2a and 2b, the electronic control system 2 comprises a central processor unit (CPU) 3, a random access memory (RAM) 4, a read only memory (ROM) 5, a nonvolatile random access memory (RAM) 4a, an input interface 6 and an output interface 7. These units, manely the CPU 3, RAM 4, RAM 4a, ROM 5, input and output interfaces 6 and 7 are connected to each other through a bus line 8. Programs and data for controlling the engine and fixed data such as the type of the vehicle are stored in the ROM 5. Power is supplied to the CPU 3, input and output interfaces 6 and 7, and driver 18 from a source BV through a contact 44a of a power relay 44 and a constant voltage circuit 45. A relay coil 44b of the relay 44 is connected to the source BV through an ignition terminal IG of an ignition switch 46.

The input interface 6 is applied with a coolant temperature signal Tw from a coolant temperature sensor 9, an air-fuel ratio feedback signal λ from an $O_2$ sensor 10, an intake-air quantity signal Q from an intake manifold quantity sensor 11, an air conditioner operating signal SWa from an air conditioner switch 12, a vehicle speed signal S from a vehicle speed sensor 13, an idling signal SWi from an idle switch 14, a throttle valve opening degree signal 8 from a throttle position sensor 15, a neutral positioning signal SWn from a neutral switch 16 in a transmission, and an engine speed signal N from an engine speed sensor 17. These signals are stored in the RAM 4 after data processes in accordance with the program stored in the ROM 5. The CPU 3 produces respective control signals which are applied to the driver 18 through the output interface 7. The driver 18 produces signals for controlling a kickdown solenoid 47 of a kickdown switch, a fuel pump relay 48, a canister controller 19 of a fuel-vapor emission control system, an EGR (exhaust gas recirculation system) actuator 20, an idling control actuator 21, ignition coils 22, and fuel injectors 23.

The driver 18 further applies signals to D-check lamps 23a and U-check lamps 23b. The D-check lamps 23a are disposed in the electronic control system 2 with CPU3, the RAMs 4 and 4a and ROMS and connected to the output interface for informing of an abnormality in the system 2. When an abnormality is detected in the system 2 by self-diagnosis function, a corresponding trouble code is read out from the ROM 5 so as to turn on or flash a plurality of lamps 23a, thereby indicating the trouble code. The U-check lamps 23b are provided on a dashboard of the vehicle so as to warn the driver of the trouble detected by the self-diagnosis function. The diagnosis device 25 has a control unit 28 and a power supply source 29. The control unit 28 comprises a CPU 36, a RAM 37, input/output (I/0) ports 39 and 40, and a timer 38. These elements are connected to each other through a bus line 35. A clock pulse generator 42 is provided for generating synchronizing pulses. A ROM 41 provided in the memory cartridge 34 is connected to the bus line 35 through the connector 33. The ROM 41 stores a plurality of programs for diagnosing various trouble of the control system 2 and fixed data, which will later be described in detail. Inputs of the I/0 port 40 are connected to the output interface 7 of the control system 2 through connectors 24 and 26 and harness 27 so as to receive output signals of the sensors and switches 9 to 17. Outputs of the port 40 are connected to the indicator section 30. Inputs of the I/0 port 39 are connected to the keyboard 32 which applies a mode select signal dependent on the operation of the keyboard, and to the output interface 7. Outputs of the port 39 are connected to the input interface 6 and the display 31. The power source 29 for supplying the power to the CPU 36 and I/0 ports 39 and 40 is connected to the source BV through the power switch 43.

The ROM 41 stores, as fixed data, a plurality of data for representing abbreviations of check items and units in a form of a table and diagnosing programs for the specific type of the vehicle.

Figure 3B:
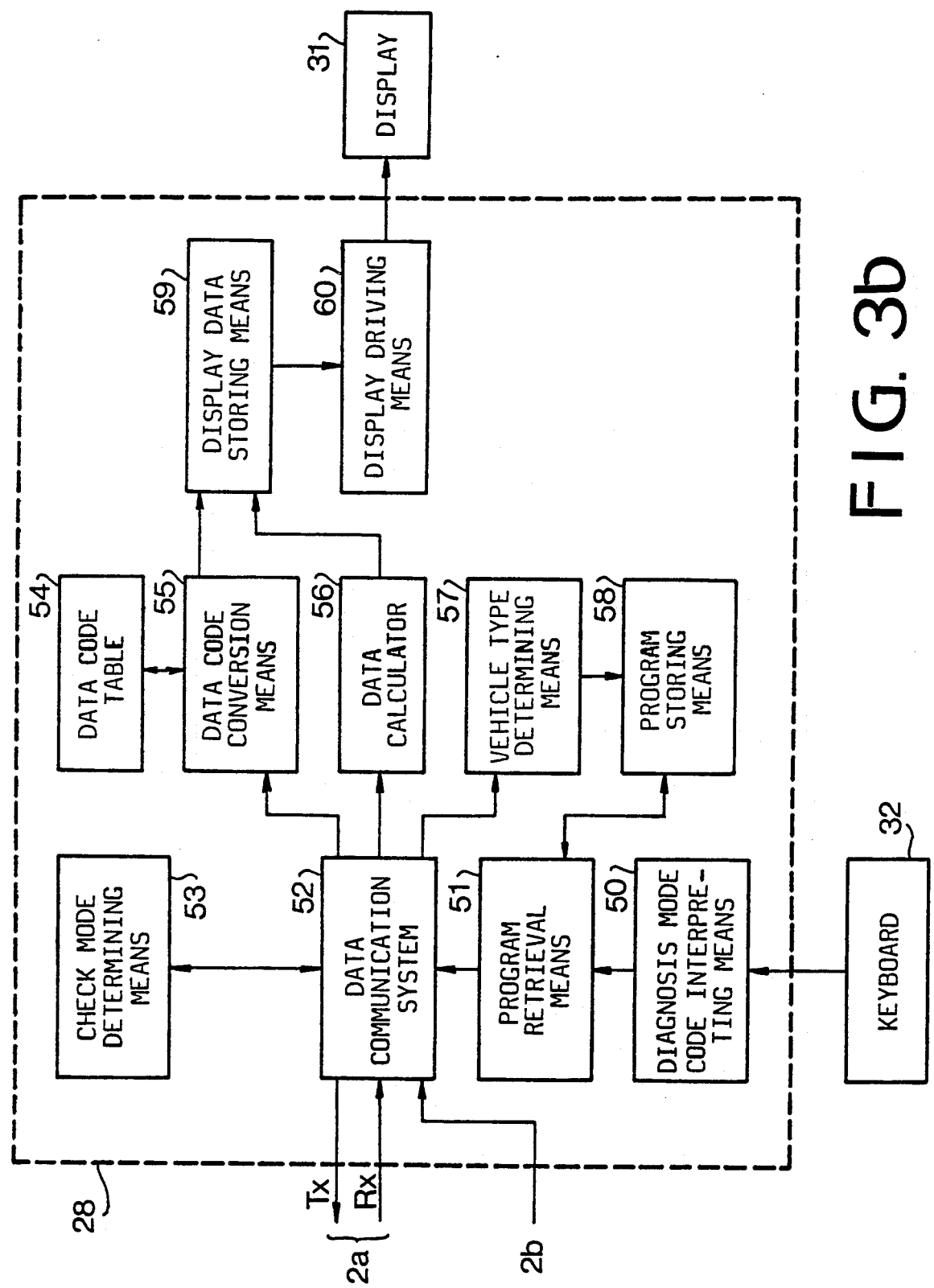
Figure 4A:
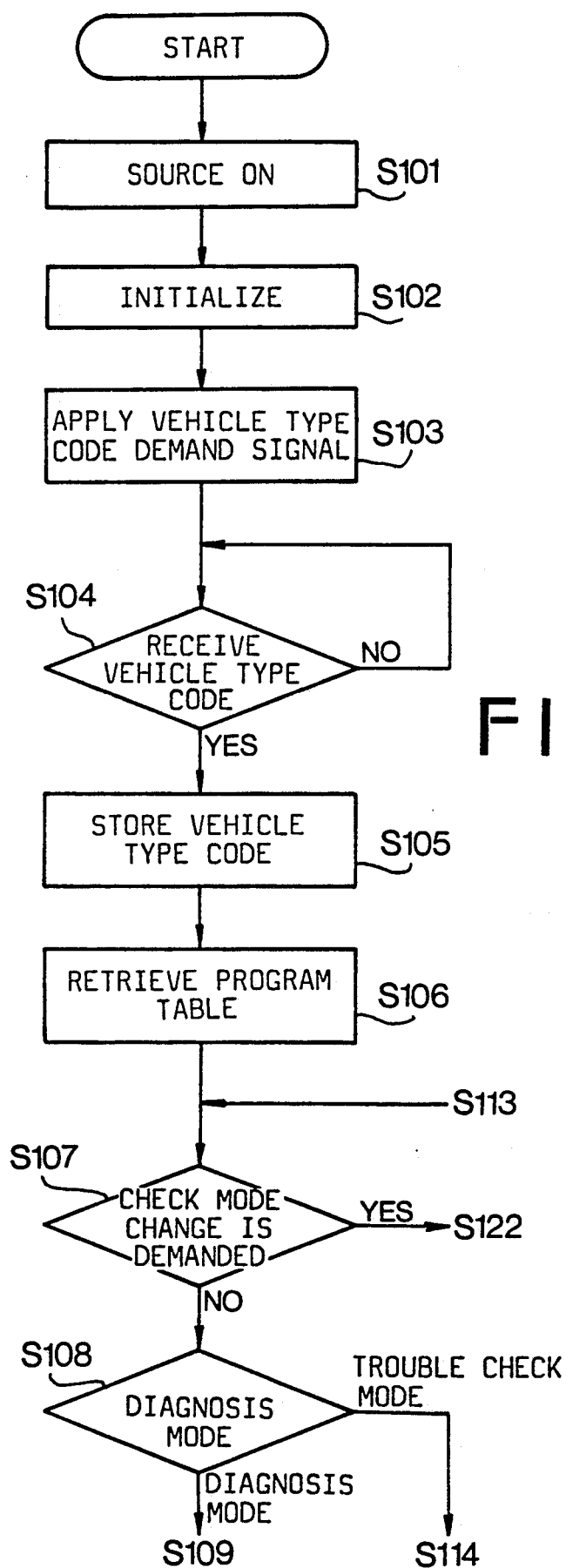
FIGS. 4a to 4d show a flowchart showing an operation of the system.
Figure 4B:
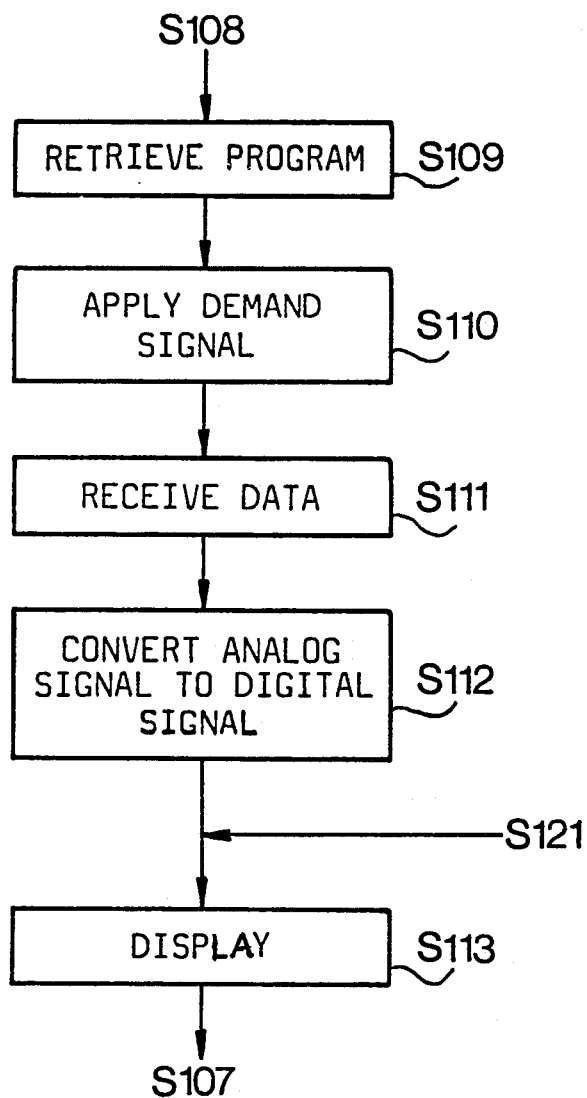
Figure 4C:
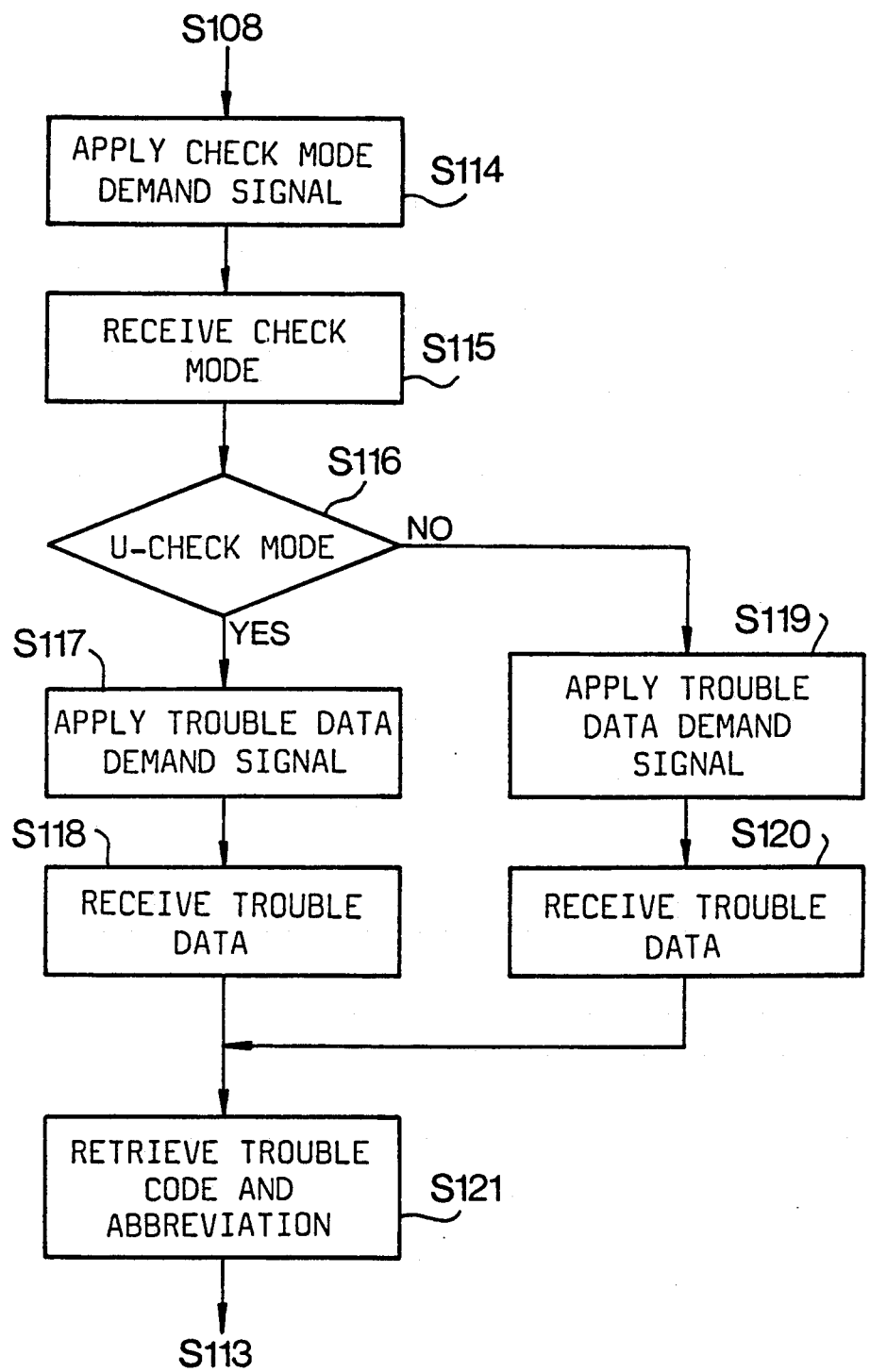
Figure 4D:
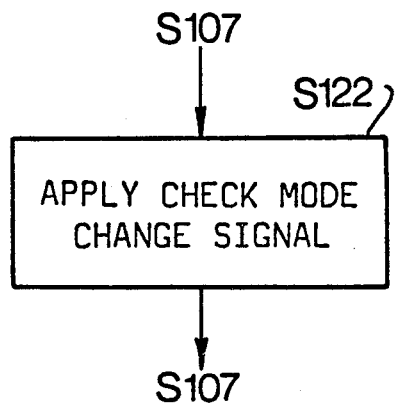

The control system 2 and the control unit 28 are described more in detail with reference to FIGS. 3a and 3b.

The control system 2 is provided with a self-diagnosis means 2a, to which output signals of the sensors and switches and output signals of a calculator 2c are applied. The output signals of the calculator 2c are applied to the actuators through the driver 18 for operating the actuators. The output signals applied to the actuators are diagnosed by the self-diagnosis means 2a and a trouble data signal dependent on the diagnosis is fed to the control unit 28.

The self-diagnosis means 2a functions in two different trouble check modes, namely a U-check mode and a D-check mode. In order to select the trouble check mode, check mode terminal 6a is provided. As shown in FIG. 2a, the check mode terminals comprise a terminal B which is grounded and a terminal A which is connected to a port P of the input interface 6 and to a power source of a predetermined voltage (5V). When terminals A and B are disconnected from each other, the port P is applied with the voltage so that a high level signal H is applied to a check mode designating means 2b. In response to the high level signal, the check mode designating means 2b sends a U-check mode signal to the control unit 28. When the terminals A and B are connected with each other, the port P is grounded so that a low level signal L is applied to the check mode designating means 2b. Accordingly, a D-check mode signal is produced.

Figure 5:
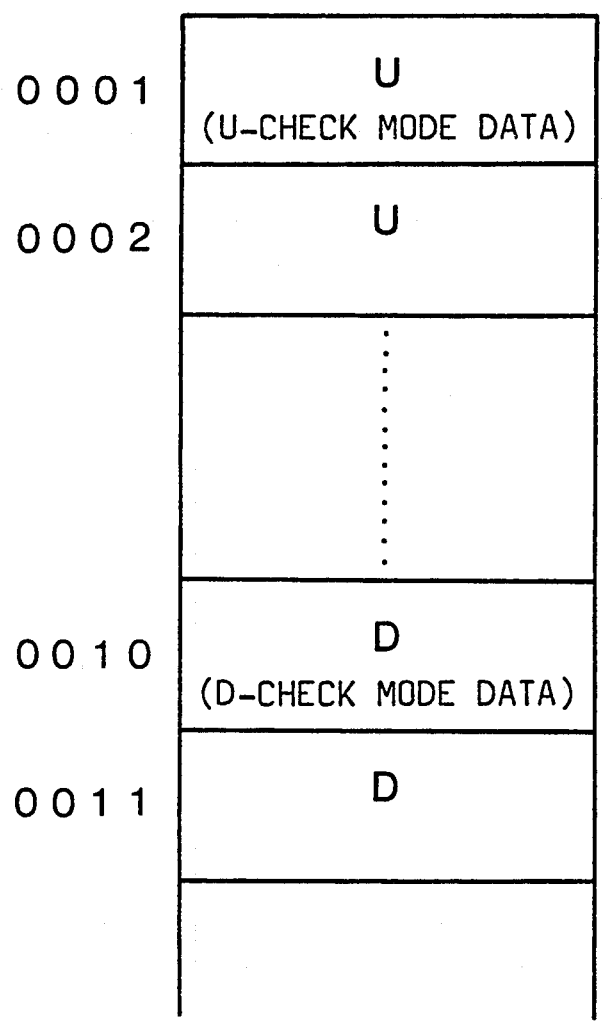
FIG. 5 is a diagram showing a table for storing trouble data.

When an abnormality is detected, the self-diagnosis means 2a applies a trouble data signal to the D-check lamps 23a or to the U-check lamps 23b dependent on the selected mode, so as to light or flash the lamps. At the same time, trouble data for both check modes are stored at respective addresses for the U-check mode and D-check mode in the nonvolatile RAM 4a as shown in FIG. 5.

The terminals A and B of the check mode terminals 6a are usually disconnected to select the U-check mode in order to warn the driver of the trouble while driving the vehicle.

The control unit 28 is provided with a diagnosis mode code interpreting means 50 which produces a mode signal in dependency on the mode input by operating the keyboard 32. The mode signal is applied to a program retrieval means 51. The control unit 28 has a vehicle type determining means 57 where the type of the vehicle stored in the ROM 5 is derived in accordance with an input signal. A program storing means 58 stores a plurality of program tables each for a specific type of vehicle. A diagnosing program dependent on the selected diagnosis mode is derived from the program table in the program retrieval means 51 in accordance with the type of the vehicle. A selected diagnosis program signal is applied to a data communication system 52 which sends a data demand signal TX to the control system 2 in accordance with a diagnosis item signal. A data signal RX representing information on the sensors or switches is applied from the self-diagnosis means 2a of the control system 2 to a data calculator 56 through data communication system 52 in accordance with the data demand signal TX. The data signal in the form of binary digits is converted into a decimal digit by the calculator 56.

The control unit 28 is further provided with a check mode determining means 53 to which the U-check mode signal or the D-check mode signal from the check mode designating means 2b of the control system 2 is fed. The check mode determining means 53 determines whether the U-check mode or the D-check mode is selected dependent on the check mode signal. The trouble data signal from the self-diagnosis means 2a is applied through the data communication system 52 to a data code conversion means 55 which retrieves trouble codes and abbreviations of defective sensors and switches from a data code table 54 in the ROM 41 and further converts them into signals to indicate the trouble code on the display 31.

Output signals of the conversion means 55 and the data calculator 56 are applied to a display data storing means 59 to store the abbreviation data and the diagnosis data in a memory map provided in the RAM 37. An output signal of the display data storing means 59 is applied to a display driving means 60 which applies driving signals to the display 31 so as to indicate the diagnosis and abbreviation data.

Before performing the diagnosis program, the control system 2 is connected to the diagnosis device 25 through the harness 27 and the cartridge 34 is attached to the diagnosis device 25.

The operation of the system is described hereinafter with reference to the flowchart of FIGS. 4a to 4d. The engine is started, and the following diagnosis program is performed under the running condition of the engine.

The power switch 43 is turned on at a step S101 and initialization of the control unit 28 is performed at a step S102. At a step S103, the data communication system 52 applies a signal for demanding a type code signal corresponding to a type code of the vehicle stored in the ROM 5 in the control system 2. At a step S104 it is determined whether the type code signal from the control system is received in the control unit 28 or not. The program goes to a step S105 when the signal is received, or the step S104 is repeated until it is. At the step S105, the vehicle type code is stored at a predetermined address in the memory of the RAM 37. At a step S106, the program table corresponding to the vehicle type is retrieved from the plurality of tables stored in the ROM 41.

A diagnostician operates the keyboard 32 to select a diagnosis mode or a trouble check mode and input a mode code corresponding to the selected mode. At a step S107, it is determined whether the input mode demands a D check mode. When the D check mode is not demanded, the program goes to a step S108 where the mode code is interpreted and it is determined whether the selected mode is a diagnosis mode or a trouble check mode.

Diagnosis Mode

In a diagnosis mode, for example, when checking the coolant temperature, a mode code F07 for coolant temperature checking item (for example F→0→7 →ENT) is input by operating the keyboard 32. The mode code is read out by the CPU 36 of the control unit 28 and temporarily stored at a predetermined address in the memory map of RAM 37. The program proceeds to a step S109 where the mode code is read out and interpreted by the mode code interpreting means 50. At a step S109, the data for an abbreviation of the check item and a unit are also read out from the ROM 41 by the program retrieval means 51 in accordance with the selected mode, and stored in the RAM 37. In the coolant temperature checking mode, data for displaying the abbreviation TW for the coolant temperature and the unit deg C are read out and stored.

The data demand signal TX depending on the selected mode is applied to the control system 2 at a step S110. At a step S111, a diagnosis data signal RX representing the coolant temperature is applied to the control unit 28 from the control system 2. At a step S112, the received binary digit is converted into a decimal digit representing the coolant temperature, and stored in the RAM 37. At a step S113, the abbreviation of the coolant temperature and the unit stored at the step S109 and the diagnosis data in decimal digits stored at the step S112 are read out and applied to the display driving means 60. Accordingly, the abbreviation TW, the mode code F07, the temperature +14 and the unit deg C of the coolant temperature are displayed on the display 31 as shown in FIG. 1a. The program returns to the step S107 for the next diagnosis.

Trouble Check Mode

When the keyboard 32 is operated to select a trouble check mode, (for example, for reading out data of the U-check mode F→B→O→ENT is input), it is determined that the selected mode is the trouble check mode at step S108 so that the program goes to a step S114. The designated mode is temporarily stored at a predetermined address in the RAM 37. At a step S114, a trouble check mode demand signal is applied to the control system 2 to determine whether the U-check mode or the D-check mode is designated at the check mode designating means 2b. At a step S115, the U-check mode signal or the D-check mode signal is applied to the control unit 28 from the control system 2. It is determined whether a received signal is the U-check mode signal or the D-check mode signal at a step S116. The program proceeds to a step S117 when the U-check mode is designated and to a step S119 when the D-check mode is designated.

Figure 6:
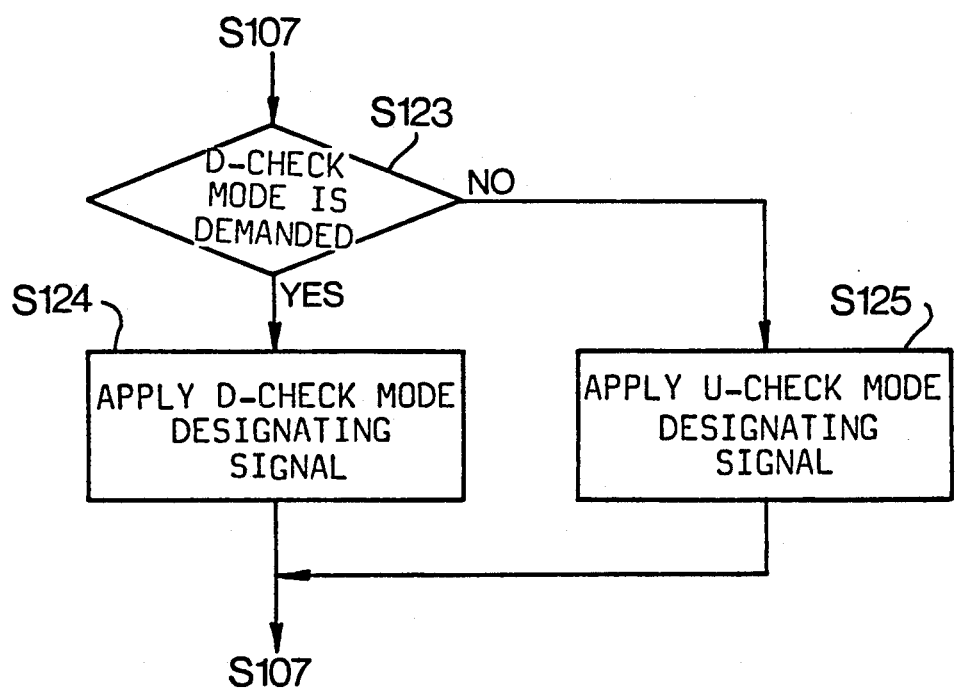
FIG. 6 is a flowchart showing an operation of a modification of the present invention.

A trouble data demand signal is applied to the control system 2 at the step S117. Trouble data, stored at a predetermined address of the nonvolatile RAM 4a, for example at address 0001 for the U-check mode (FIG. 5), are read out and a signal representing the trouble data is applied to the control unit 28 (step S118). At a step S121, the trouble code and abbreviation corresponding to the trouble data are retrieved from the ROM 41 and stored at a predetermined address in the RAM 37. At the same time, the trouble codes stored at the previous program are cleared. The trouble code signal is further applied to the display driving means. Thereafter the program goes to the step S113. The trouble code and the abbreviation indicating the defective part such as an actuator is displayed on the display 31. For example, when the idle speed control valve is defective, trouble code 24 and abbreviation ISC are displayed as shown in FIG. 1b. Thus, the diagnostician checks the indicated part to examine the actual condition thereof while consulting an instruction manual. When the D-check mode is determined at the step S116, the program goes to steps S119 and S120 where similar procedures are performed as in the steps S117 and S118. The trouble data of the D-check mode are stored at an address for the D-check mode such as address 0010 shown in FIG. 5. In order to perform a diagnosis in the D-check mode, a D-check mode code (for example, F→E→O→ENT) is input at step S107, and the program goes to a step S122. At the step S122, a check mode change signal is applied to the check mode designating means 2b of the control system 2 through the communication system 52. Consequently, although the terminals A and B of check mode terminals 6a are disconnected from each other to select the U-check mode, the D-check mode is designated at the check mode designating means 2b. Thereafter, the program returns to the step S107, thereby performing the aforementioned steps of the trouble check mode. FIG. 6 shows a part of a flowchart of the operation for changing the check mode in a modification of the present invention.

In order to change the check mode, the keyboard 32 is operated to input a mode code for example, F→E→O→ENT to designate the D-check mode, or to input a mode code, for example, F→E→1→ENT to designate the U-check mode. The program goes to a step S123 where it is determined whether the change designated by the mode code is a change to the D-check mode or a change to a U-check mode. When the U-check mode is to be changed to the D-check mode, a D-check mode designating signal is applied to the trouble check mode designating means 2b at a step S124. Consequently, although the U-check mode is selected in accordance with the disconnection of the terminals A and B of the check mode terminals 6a, the D-check mode is designated.

On the other hand, when the U-check mode is selected under the D-check mode, the program goes to a step S125, thereby designating the U-check mode. Accordingly, a U-check designating signal is applied to the designating means 2b to designate the U-check mode.

From the foregoing, it will be understood that the present invention provides a diagnosis system where the trouble check mode is easily changed to another mode so that the diagnostic operation is greatly improved.

While the presently preferred embodiments of the present invention have been shown and described, it is to be understood that this disclosure is for the purpose of illustration and that various changes and modifications may be made without departing from scope of the invention as set forth in the appended claims.

What is claimed is:

1. A diagnosis system for diagnosing an electronic control system for a vehicle, the electronic control system comprising sensing means for detecting operation conditions of the vehicle, and a first control unit responsive to the operation conditions for providing control signals for controlling the vehicle, the diagnosis system comprising a diagnosis device with a keyboard for inputting a code, a second control unit responsive to the code for diagnosing the electronic control system, display means for displaying diagnosis data diagnosed by the second control unit, and connecting means electrically connecting the diagnosis device to the electronic control system, said first control unit comprising a programmed control system comprising self-diagnosis means for checking trouble in the electronic control system and for storing the trouble as trouble data and designation means for designating one of a plurality of test modes for the trouble data to said self-diagnosis means;

said second control unit comprising a programmed control system comprising:

interpreting means for interpreting the code inputted from the keyboard as a first specific code for checking the trouble data and for producing a first signal;

communication means for applying a first command signal to the self-diagnosis means in response to the first signal for feeding the trouble data from the self-diagnosis means under a test mode designated by the designation means;

means for processing the trouble data fed from the self-diagnosis means by the communication means to display the trouble data on the display means;

said interpreting means for interpreting the code inputted from the keyboard as a second specific code for changing the test mode and for producing a second signal;

said communication means being responsive to the second signal for applying a second command signal to the designation means; and said designation means being responsive to the second command signal for changing the test mode of the self-diagnosis means.

2. The diagnosis system according to claim 1, wherein said processing means comprises conversion means for converting the trouble data fed from the self-diagnosis means by the communication means into a corresponding trouble code and abbreviation to indicate the trouble mode and the abbreviation on the display means.

3. A diagnosis system for diagnosing an electronic control system for a vehicle, the electronic control system comprising sensing means for detecting operation conditions of the vehicle, and a first control unit responsive to the operation conditions for providing control signals for controlling the vehicle, the diagnosis system comprising a diagnosis device with a keyboard for inputting a code, a second control unit responsive to the input code for diagnosing the electronic control system, display means for displaying diagnosis data diagnosed by the second control unit, and connecting means electrically connecting the diagnosis device to the electronic control system, the first control unit comprising a programmed control system comprising self-diagnosis means for checking trouble in the electronic control system and for storing the trouble as trouble data and designation means for designating one of a plurality of test modes for the trouble data to said self-diagnosis means;

said second control unit comprising a programmed control system comprising:

first determining means for determining whether the input code is a first specific code for changing the test mode;

second determining means for determining whether the input code is a second specific code for checking the trouble data when the first specific code for changing the test mode is not determined by said first determining means;

first applying means for applying a test mode demand signal to the electronic control system for demanding a present test mode of the self-diagnosis means when the second specific code for checking the trouble data is determined by said second determining means;

first receiving means for receiving the present test mode demanded by said applying means from the designation means;

third determining means for determining the kind of the present test mode received by said first receiving means;

second applying means responsive to the kind of the present test mode for applying a trouble data demand signal to the self-diagnosis means for demanding the trouble data;

second receiving means for receiving the trouble data demanded by said second applying means from the electronic control system;

retrieving means for retrieving a trouble code and abbreviation corresponding to the trouble data received by said second receiving means based on the present test mode determined by said third determining means;

displaying means for displaying the trouble code and the abbreviation on the display means; and third applying means for applying a test mode change signal to the designation means for changing the designation of the test mode the self-diagnosis means when the first specific code for changing the test mode is determined by said first determining means.

* * * * *